United States Patent
Lee et al.

(10) Patent No.: US 11,195,827 B2
(45) Date of Patent: Dec. 7, 2021

(54) SEMICONDUCTOR INTEGRATED CIRCUIT DEVICE INCLUDING AN ELECTRO-STATIC DISCHARGE PROTECTION CIRCUIT

(71) Applicant: SK hynix Inc., Icheon-si Gyeonggi-do (KR)

(72) Inventors: Chang Hwi Lee, Seoul (KR); Jin Woo Kim, Icheon-si Gyeonggi-do (KR); Hyun Duck Lee, Suwon-si Gyeonggi-do (KR); Seung Yeop Lee, Icheon-si Gyeonggi-do (KR); Ju Hyeong Lee, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 194 days.

(21) Appl. No.: 16/258,167

(22) Filed: Jan. 25, 2019

(65) Prior Publication Data

US 2019/0379204 A1 Dec. 12, 2019

(30) Foreign Application Priority Data

Jun. 11, 2018 (KR) .................. 10-2018-0066727

(51) Int. Cl.
*H01L 27/02* (2006.01)

(52) U.S. Cl.
CPC ...... *H01L 27/0274* (2013.01); *H01L 27/0292* (2013.01); *H01L 27/0296* (2013.01)

(58) Field of Classification Search
CPC .. G01R 1/36; G01R 31/2884; G01R 31/2851; H01L 27/0248; H01L 27/0251; H01L 27/0266; H01L 27/0274; H01L 27/0277; H01L 27/0292; H01L 27/0296; H02H 3/023; H02H 3/22; H02H 9/046
See application file for complete search history.

(56) References Cited

U.S. PATENT DOCUMENTS

| | | | | |
|---|---|---|---|---|
| 6,274,908 B1 * | 8/2001 | Yamaguchi | ......... | H01L 27/0251 257/355 |
| 6,803,633 B2 * | 10/2004 | Mergens | ............ | H01L 27/0292 257/173 |
| 8,305,719 B2 * | 11/2012 | Kim | .................... | H01L 27/0274 361/56 |
| 9,607,977 B1 * | 3/2017 | Wang | .................... | H01L 27/027 |
| 10,366,974 B2 * | 7/2019 | Raad | ................... | H01L 29/7833 |
| 10,446,537 B2 * | 10/2019 | Boselli | ............... | H01L 29/0649 |

(Continued)

FOREIGN PATENT DOCUMENTS

| | | |
|---|---|---|
| KR | 101091126 B1 | 12/2011 |
| KR | 1020160065745 A | 6/2016 |
| KR | 1020170067643 A | 6/2017 |

*Primary Examiner* — Fred E Finch, III
(74) *Attorney, Agent, or Firm* — William Park & Associates Ltd.

(57) ABSTRACT

A semiconductor integrated circuit device may include a pad, a first voltage protection circuit and a second voltage protection circuit. The first voltage protection circuit may be connected with the pad. The second voltage protecting circuit may be connected between the first voltage protection circuit and a ground terminal. The first voltage protection circuit may include a gate positive p-channel metal oxide semiconductor (GPPMOS) transistor. The second voltage protection circuit may include serially connected GPPMOS transistors.

13 Claims, 6 Drawing Sheets

(56) References Cited

U.S. PATENT DOCUMENTS

| | | | | |
|---|---|---|---|---|
| 2003/0235022 A1* | 12/2003 | Lai | .................. | H01L 27/0274 |
| | | | | 361/111 |
| 2007/0069310 A1* | 3/2007 | Song | .................. | H01L 27/0262 |
| | | | | 257/409 |
| 2010/0246076 A1* | 9/2010 | Campi, Jr. | .................. | G06F 30/30 |
| | | | | 361/56 |
| 2012/0074926 A1* | 3/2012 | Sugiyama | .................. | H01L 27/0274 |
| | | | | 324/76.11 |
| 2012/0098046 A1* | 4/2012 | Kim | .................. | H01L 27/0274 |
| | | | | 257/296 |
| 2013/0020646 A1* | 1/2013 | Deval | .................. | H01L 29/861 |
| | | | | 257/355 |
| 2013/0163128 A1* | 6/2013 | Wijmeersch | .................. | H01L 27/0262 |
| | | | | 361/56 |
| 2017/0244244 A1* | 8/2017 | Ikeda | .................. | H01L 27/0288 |
| 2017/0346281 A1* | 11/2017 | Tanaka | .................. | H01L 27/0255 |
| 2018/0350797 A1* | 12/2018 | Lee | .................. | H02H 9/046 |
| 2020/0294992 A1* | 9/2020 | Hung | .................. | H02H 9/046 |

\* cited by examiner

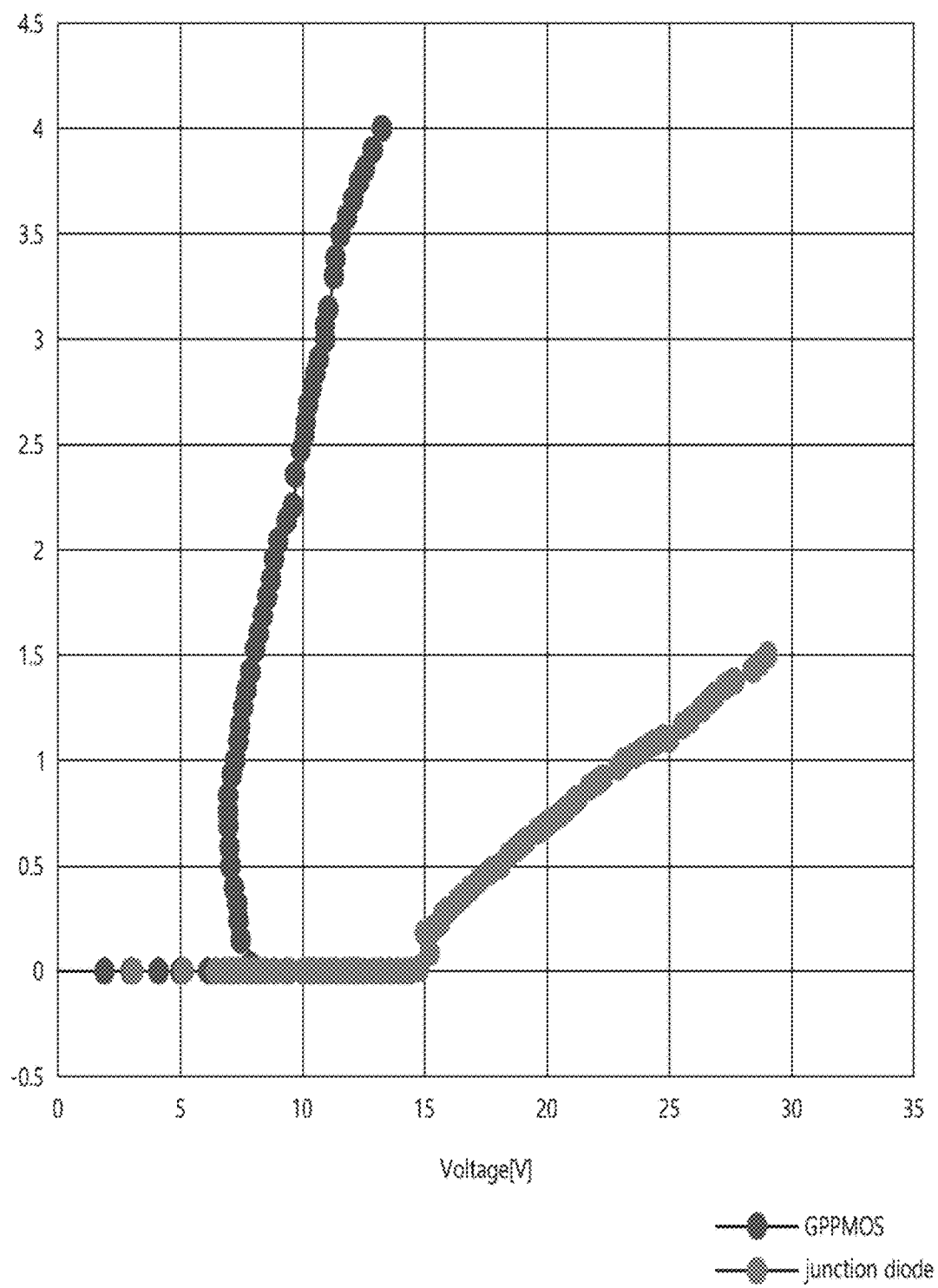

SEMICONDUCTOR INTEGRATED CIRCUIT DEVICE INCLUDING AN ELECTRO-STATIC DISCHARGE PROTECTION CIRCUIT

CROSS-REFERENCES TO RELATED APPLICATION

The present application claims priority under 35 U.S.C. § 119(a) to Korean application number 10-2018-0066727, filed on Jun. 11, 2018, in the Korean Intellectual Property Office, which is incorporated herein by reference in its entirety.

BACKGROUND

1. Technical Field

Various embodiments may generally relate to a semiconductor integrated circuit device, more particularly, to a semiconductor integrated circuit device including an electrostatic discharge protection circuit.

2. Related Art

In order to protect internal circuits of a semiconductor integrated circuit device from an electrostatic charge, the semiconductor integrated circuit device may include a circuit for protecting an electro-static discharge (ESD) between pads for receiving external signals or addresses or between the pads and the internal circuits.

The semiconductor integrated circuit device may further include a test pad for receiving a test voltage as well as the pads for receiving the signals and the address. The test pad may directly make contact with a test probe. The test pad may receive various voltages such as a low negative voltage, a high positive voltage, etc.

The test pad may be electrically connected with a test circuit. Because a high voltage may be applied to the test pad, the electro-static discharge ESD protection circuit may not accurately discriminate the test voltage from an electro-static voltage. The ESD protection circuit may not be arranged between the test pad and the test circuit.

When the ESD protection circuit is installed between the test pad and the test circuit, it may be important to set a trigger voltage of the ESD protection circuit. That is, it may be required to set the trigger voltage of the ESD protection circuit higher than the normal high voltage and lower than the electro-static voltage. Further, it may be required to set a threshold voltage at which a latch-up may be generated in the ESD protection circuit (hereinafter, referred to as a holding voltage) higher than the normal high voltage. Thus, it may be required to provide the ESD protection circuit with a correctable structure for readily controlling the trigger voltage.

SUMMARY

In an embodiment of the present disclosure, a semiconductor integrated circuit device may include a pad, a first voltage protection circuit and a second voltage protection circuit. The first voltage protection circuit may be connected with the pad. The second voltage protecting circuit may be connected between the first voltage protection circuit and a ground terminal. The first voltage protection circuit may include a gate positive p-channel metal oxide semiconductor (GPPMOS) transistor. The second voltage protection circuit may include serially connected GPPMOS transistors.

In an embodiment of the present disclosure, a semiconductor integrated circuit device may include an ESD protection circuit. The ESD protection circuit may be turned-off when a normal voltage may be applied to the circuit from a pad. The ESD protection circuit may be turned-on when a voltage above and below the normal voltage may be applied to the circuit from the pad. The ESD protection circuit may include a GPPMOS transistor, a plurality of GPPMOS transistors and a signal transmission path. The GPPMOS transistor may be connected to the pad. The plurality of the GPPMOS transistors may be serially connected between the GPPMOS transistor and a ground terminal.

In example embodiments of the present disclosure, a semiconductor integrated circuit device may include an ESD protection circuit. The ESD protection circuit may include a GPPMOS transistor and a plurality of GPPMOS transistors. The GPPMOS transistor may form a first voltage protection circuit connected to a pad. The plurality of the GPPMOS transistors may be serially connected with each other. The GPPMOS transistors may form a second voltage protection circuit connected between the GPPMOS transistor and a ground terminal. The GPPMOS transistors in the first and second voltage protection circuits may include a p-type semiconductor substrate, a plurality of n-wells, a plurality of gates, source and drain, and a common wiring. The n-wells may be formed in the p-type semiconductor substrate. The n-wells may be directly connected to the p-type semiconductor substrate. The gates may be arranged at the n-wells. The source and the drain may be formed in the n-wells at both sides of the gates. The source and the drain may include high concentration p-type impurities. The common wiring may be commonly connected between the gate on the n-well and the source. The GPPMOS transistor in the first voltage protection circuit and the GPPMOS transistors in the second voltage protection circuit may be integrated on the different n-wells.

In an embodiment of the present disclosure, a semiconductor integrated circuit device may include a pad, a first voltage protection circuit and a second voltage protection circuit. The first voltage protection circuit may be connected to the pad, the first voltage protection circuit including a first gate positive p-channel metal oxide semiconductor (GPPMOS) transistor having a gate coupled to a source of the first gate positive p-channel metal oxide semiconductor (GPPMOS) transistor and a drain coupled to the pad. The second voltage protection circuit connected between the first voltage protection circuit and a ground terminal, the second voltage protection circuit including a plurality of serially connected gate positive p-channel metal oxide semiconductor (GPPMOS) transistors. A first GPPMOS transistor of the second voltage protection circuit may have a source coupled to the source of the first GPPMOS transistor of the first voltage protection circuit and a gate couple to the source of the second voltage protection circuit.

BRIEF DESCRIPTION OF THE DRAWINGS

FIG. 5 is a graph showing current-voltage characteristics of a GPPMOS transistor and a reverse biased junction diode in accordance with embodiments.

DETAILED DESCRIPTION

Various embodiments will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the disclosure as defined in the appended claims.

The embodiments are described herein with reference to cross-section and/or plan illustrations. However, embodiments should not be construed as limiting. Although a few embodiments will be shown and described, it will be appreciated by those of ordinary skill in the art that changes may be made in these embodiments without departing from the principles and spirit of the disclosure.

Figure 1:
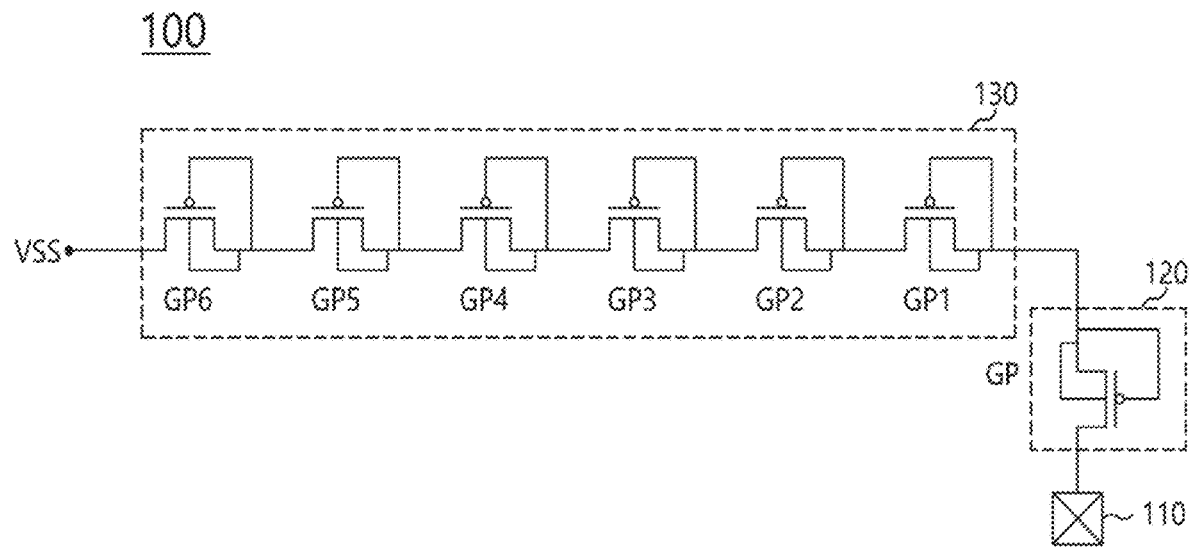
FIG. 1 is a circuit diagram illustrating a semiconductor integrated circuit device including an ESD protection circuit in accordance with embodiments.

FIG. 1 is a circuit diagram illustrating a semiconductor integrated circuit device including an ESD protection circuit in accordance with various embodiments.

Referring to FIG. 1, the ESD protection circuit 100 may include a first voltage protection circuit 120 and a second voltage protection circuit 130.

The first voltage protection circuit 120 may be connected between a pad 110 and the second voltage protection circuit 130. For example, the pad 110 may include a test pad or a probe pad into which a test signal may be inputted.

The first voltage protection circuit 120 may include at least one PMOS transistor. For example, the first voltage protection circuit 120 may include at least one gate positive p-channel metal oxide semiconductor (GPPMOS) transistor. The GPPMOS transistor (i.e., GP) in the first voltage protection circuit 120 may include a gate and a source commonly connected with each other, and a drain connected to the pad 110. The GPPMOS transistor may be denoted by a P-N-P (PNP) bipolar transistor. Because the drain of the GPPMOS transistor may be connected to the pad 110, the first voltage protection circuit 120 may be driven when a negative electro-static voltage is inputted into the first voltage protection circuit 120.

The second voltage protection circuit 130 may be connected between the first voltage protection circuit 120 and a ground terminal Vss. The second voltage protection circuit 130 may include a plurality of GPPMOS transistors GP1~GP6. The GPPMOS transistors GP1~GP6 may be serially connected with each other between the first voltage protection circuit 120 and the ground terminal Vss. For example, a source of the first GPPMOS transistor GP1 may be connected to the source of the first voltage protection circuit 120. A drain of the first GPPMOS transistor GP1 may be connected to a source of the second GPPMOS transistor GP2. The GPPMOS transistors GP1~GP6 may be serially connected with each other in the above-mentioned connection manner. Thus, when a positive electrostatic charge flows from the pad 110, the positive electrostatic charge may be effectively discharged by the serially connected GPPMOS transistors GP1~GP6.

The GPPMOS transistors GP1~GP6 in the second voltage protection circuit 130 may have a PMOS transistor structure in which a gate and a source may be commonly connected with each other similarly to the first protection circuit 120. The GPPMOS transistor may drop a voltage by a trigger voltage by turning-on of a parasitic diode or a parasitic PNP transistor when the positive electrostatic charge is generated.

The GPPMOS transistor in the first voltage protection circuit 120 and the GPPMOS transistors GP1~GP6 in the second voltage protection circuit 120 may have substantially the same type. However, an electro-static voltage may be inputted into the drain of the first voltage protection circuit 120 differently from the second voltage protection circuit 130. Thus, the first voltage protection circuit 120 may be turned-on when a negative voltage is applied to the pad 110.

The GPPMOS transistor may have a snapback less than that of a gate grounded NMOS (GGNMOS) transistor. Therefore, because a snapback section may not be considered in setting the trigger voltage of the GPPMOS transistor, it may not be required to decrease a holding voltage. As a result, when the GPPMOS transistor is used in the ESD protection circuit 100, a latch-up in the GPPMOS transistor may be less than that in the GGNMOS transistor. The gate and the source in the GPPMOS transistors 120 and GP1~GP6 may be commonly connected with each other, the GPPMOS transistors 120 and GP1~GP6 may be driven in a diode manner.

Numbers of the GPPMOS transistors GP1~GP6 in the second voltage protection circuit 130 may be set in accordance with a maximum high voltage level in a range of a normal voltage and the electro-static voltage. For example, when the normal voltage is to within about −2V to about 28V, the electro-static voltage may be no less than about 30V, and the trigger voltage of the GPPMOS transistor in the first and second voltage protection circuits 120 and 130 is about 7V, the second voltage protection circuit 130 should include at least four GPPMOS transistors in accordance with a voltage distribution principle. For example, the normal voltage may be an operating voltage of an internal circuit.

$$(7V \times 4)_{second\ voltage\ protection\ circuit} + 0.7V_{first\ voltage\ protection\ circuit} \approx 28.7V \quad \text{Formula 1}$$

Thus, the numbers of the GPPMOS transistors in the second voltage protection circuit 130 may be changed in accordance with the level of the positive electro-static voltage.

Figure 2:
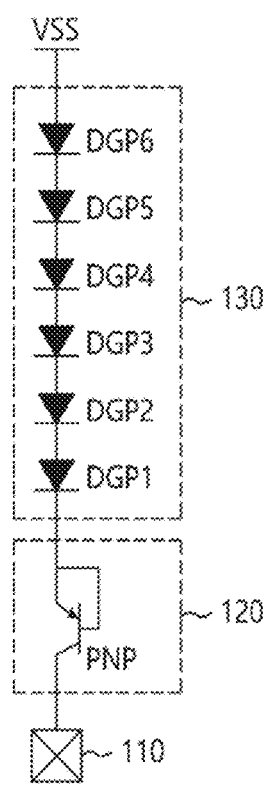
FIG. 2 is an equivalent circuit diagram illustrating the ESD protection circuit in FIG. 1 when a negative electrostatic voltage is to applied to a pad in accordance with embodiments.

FIG. 2 is an equivalent circuit diagram illustrating the ESD protection circuit 100 in FIG. 1, when a negative electro-static voltage is applied to a pad in accordance with various embodiments.

Referring to FIG. 2 and the ESD protection circuit 100D, when the negative electro-static voltage is applied to the pad 110, the first voltage protection circuit 120 may be driven as a PNP bipolar transistor and the second voltage protection circuit 130 may be driven as a plurality of diodes DGP1~DGP6 serially connected with each other between the first voltage protection circuit 120 and the ground terminal Vss.

For example, when the negative electro-static voltage is applied to the pad 110, as illustrated in FIG. 2, the diodes DGP1~DGP6 may be driven in a forward diode.

When the negative electro-static voltage no less than the trigger voltage is applied to the pad 110, the GPPMOS transistor of the first voltage protection circuit 120, which is represented as the PNP bipolar transistor may be turned-on.

Thus, the PNP bipolar transistor may effectively discharge the negative electrostatic charge.

Figure 3:
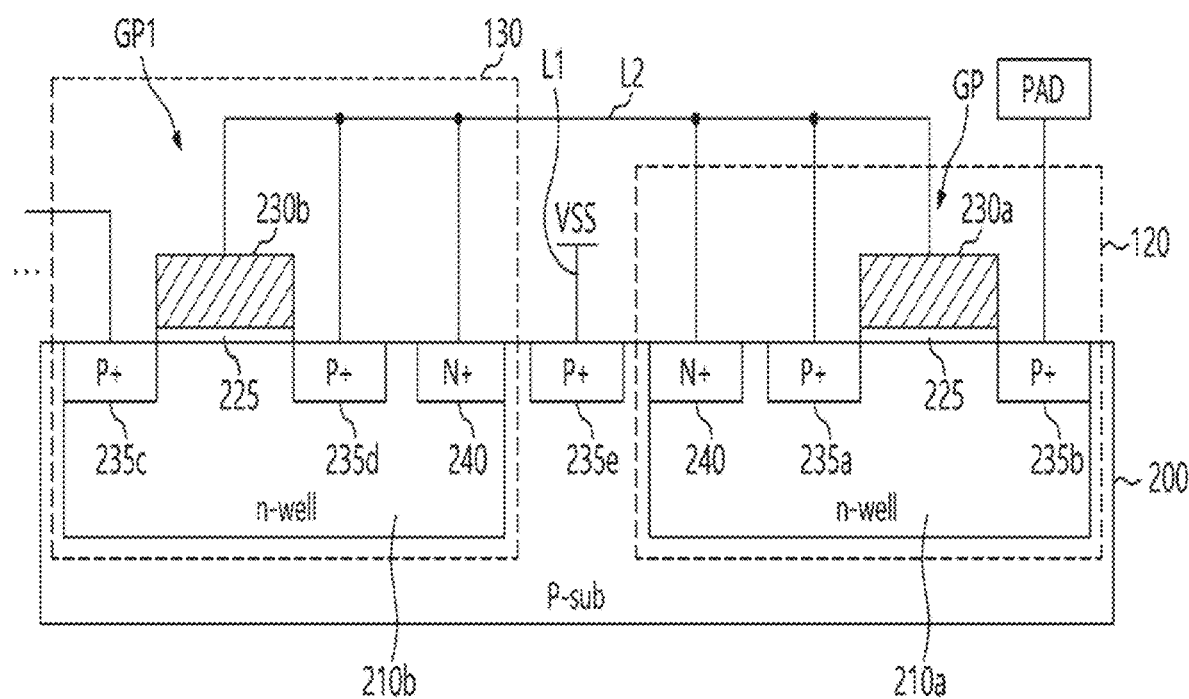
FIG. 3 is a cross-sectional view illustrating the semiconductor integrated circuit device in FIG. 1 on a semiconductor substrate.

FIG. 3 is a cross-sectional view illustrating the semiconductor integrated circuit device in FIG. 1 on a semiconductor substrate. For convenience of explanations, FIG. 3 illustrates the GPPMOS transistor GP of the first voltage protection circuit 120 and the first GPPMOS transistor GP1 of the second voltage protection circuit 130 in FIG. 1. Although not depicted in FIG. 3, the second to six GPPMOS transistors GP2~GP6 may have configurations substantially the same as those of the first GPPMOS transistor GP1.

Referring to FIG. 3, n-type impurities may be implanted into a p-type semiconductor substrate 200 to form first and second n-wells 210a and 210b. The first n-well 210a may correspond to an active region where the first voltage protection circuit 120 may be formed. The second n-well 210b may correspond to an active region where the GPPMOS transistor of the second voltage protection circuit 130 may be formed. Each of the GPPMOS transistors GP1~GP6 of the second voltage protection circuit 130 may be formed in the separated second n-wells 210b or one second n-well 210b.

A gate 230a of the first voltage protection circuit 120 may be positioned on the first n-well 210a. A drain 235a and a source 235b of the first voltage protection circuit 120 may be formed in the first n-wells 210a at both sides of the gate 230a. The drain 235a and the source 235b of the first voltage protection circuit 120 may correspond to a high concentration p-type impurity region. Further, a gate insulating layer 225 may be interposed between the gate 235a and the first n-well 210a. Thus, the first voltage protection circuit 120 including the GPPMOS transistor may be completed.

A gate 230b of the first GPPMOS transistor GP1 in the second voltage protection circuit 130 may be formed on the second n-well 210b. A drain 235c and a source 235d of the first GPPMOS transistor GP1 may be formed in the second n-wells 210b at both sides of the gate 230b. The drain 235c and the source 235d may correspond to a p-type impurity region. Further, a gate insulating layer 225 may be interposed between the gate 230b and the second n-well 210b to complete the first GPPMOS transistor GP1. A high concentration p-type impurity region 235e may be formed in the p-type semiconductor substrate 200. The high concentration p-type impurity region 235e may be formed simultaneously with the drain and the source 235a-235d. The high concentration p-type impurity region may correspond to a substrate pick-up region. A well pick-up region 240 may be formed in the first n-well 210a and the second n-well 210b. The well pick-up region 240 may correspond to an n-type high concentration impurity region. The substrate pick-up region 235e may be connected with the ground voltage terminal Vss through a first conductive wiring L1. The well pick-up region 240, the gate 230a and the drain 235a of the PMOS transistor GP in the first voltage protection circuit 120, and the gate 230b and the source 235d of the first GPPMOS transistor GP1 in the second voltage protection circuit 130 may be commonly connected with each other through a second conductive wiring L2.

When the negative electrostatic charge having a low voltage level flows into the pad 110, the GPPMOS transistor of the first voltage protection circuit 120 is driven as a parasitic PNP bipolar transistor, to may effectively discharge the negative electrostatic charge.

When the positive electrostatic charge flows into the pad 110, the serially connected GPPMOS transistors GP1 to GPC of the second voltage protection circuit 130 may be driven to effectively discharge the positive electrostatic charge.

A concentration of a body (substrate) used as a base of the parasitic PNP bipolar transistor, i.e., a concentration of the n-well 210a may be inversely proportional to a breakdown voltage of the PMOS transistor.

$$VB = F_s \varepsilon^2 / 2eN_B \qquad \text{Formula 2}$$

In Formula 2, $\varepsilon_s$ may represent a dielectric constant of the body, E may represent a maximum electric field between the source and the drain, and $N_B$ may represent the concentration of the body.

In a case that the p-well may be formed on the semiconductor substrate and the n-well may be formed in the p-well, when the positive electrostatic charge having a high voltage level flows, the electro-static voltage may be applied to the n-well used as the body of the parasitic PNP bipolar transistor. Thus, a PN junction may be generated between the n-well and the p-well to generate a leakage current due to the breakdown voltage. In order to prevent the generation of the leakage current, the n-wells 210a and 210b of the present embodiment may be directly formed in the bare p-type semiconductor substrate 200, not in the p-well.

A concentration of the p-well in the p-type semiconductor substrate 200 may be higher than a concentration of the p-type semiconductor substrate 200. Thus, a break down voltage of the GPPMOS transistor formed in the n-well directly formed in the p-type semiconductor substrate is higher than that of the GPPMOS transistor formed in the n-well formed in the p-well. Thus, the leakage current of the GPPMOS transistors GP and GP1 to GP6 is reduced, when discharging the positive electrostatic charge.

Figure 4A:
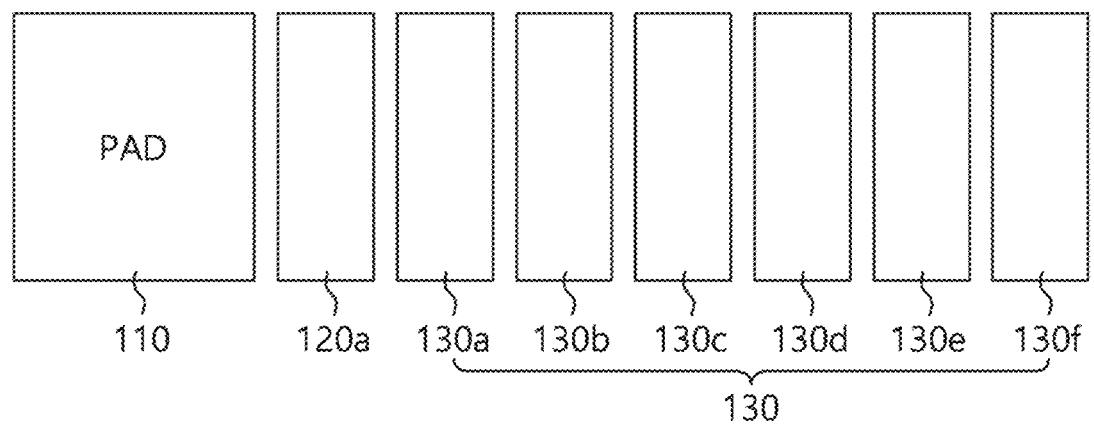
FIG. 4A and FIG. 4B are a plan view illustrating an active region of an ESD protection circuit in accordance with various embodiments.
Figure 4B:
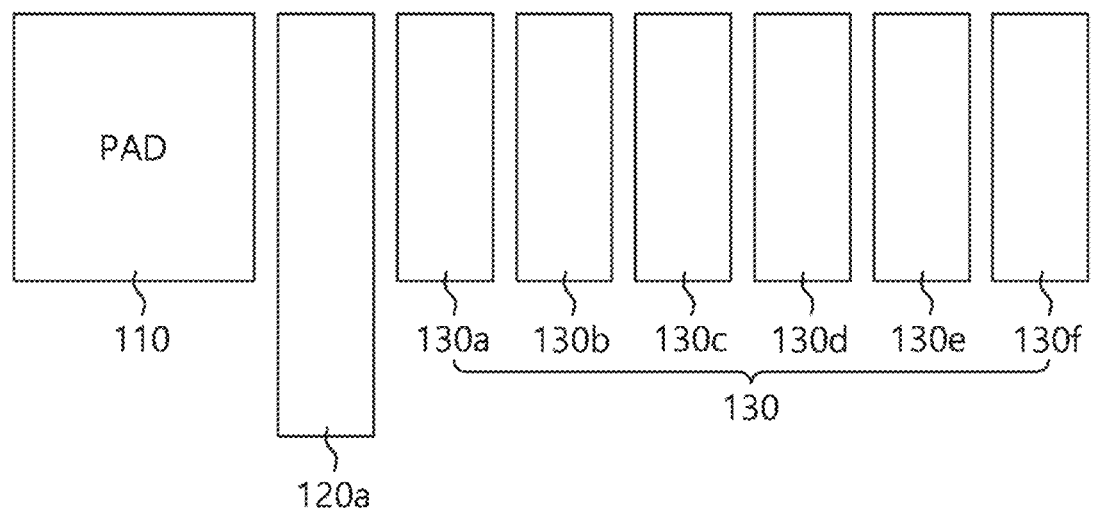

FIG. 4A and FIG. 4B are a plan view illustrating an active region of an ESD protection circuit in accordance with various embodiments.

Referring to FIG. 4A, a first active region 120a may be positioned at one side of the pad 110. The GPPMOS transistor of GP The first voltage protection circuit 120 may be formed in the first active region 120a, Second active regions 130a-130f may be sequentially positioned at one side of the first active region 120a of the first voltage protection circuit 120. The GPPMOS transistors GP1~GP6 of the second voltage protection circuit 130 may be formed in the second active regions 130a-130f. Although, a kind of the GPPMOS transistor of the first voltage protection circuit 120 is different from a kind of the GPPMOS transistors of the second voltage protection circuit 130, the first active region 120a and each of the second active regions 130a-130f may have substantially the same size.

Meanwhile, as shown in FIG. 4B, in case that the first voltage protection circuit 120 is composed of a reversed biased junction diode, the first active region 120a may be formed to have an area lager than the second active region 130a-130f to obtain a current property same with that of the GPPMOS transistor the first voltage protection circuit 120.

A following table 1 may represent areas by switching elements with respect to the trigger voltage.

TABLE 1

| Kinds of switching elements | Trigger voltage | area |
| --- | --- | --- |
| GPPMOS transistor | 7 V | 600 μm² |
| Reverse biased PN junction diode | 15 V | 1600 μm² |

As illustrated in Table 1, the trigger voltage of the GPPMOS transistor may be lower than the trigger voltage of the PN diode. For example, the GPPMOS transistor having the trigger voltage of about 7V may require an area of about 600 μm². In contrast, the reverse biased PN diode having the trigger voltage of about 15V may require an area of about 1600 μm² of about three times 600 μm². Thus, when the GPPMOS transistor may be applied to the ESD protection circuit, area efficiency may be improved compared than applying the reverse biased PN diode.

A following table 2 may represent current efficiency by switching elements.

TABLE 2

| Kinds of switching elements | Trigger voltage | Area efficiency |
| --- | --- | --- |
| GPPMOS transistor | 7 V | 4 mA/μm |
| Reverse biased PN junction diode | 15 V | 1.5 mA/μm |

As illustrated in Table 2, the GPPMOS transistor having the trigger voltage of about 7V may have about 4 mA/μm. In contrast, the reverse biased PN diode having the trigger voltage of about 15V may have about 1.5 mA/μm. Thus, the area efficiency of the GPPMOS transistor may be superior to that of the reverse biased PN diode.

FIG. 5 is a graph showing current-voltage characteristics of a GPPMOS transistor and a reverse biased junction diode in accordance with examples of embodiments.

Referring to FIG. 5, the GPPMOS transistor of the first voltage protection circuit 120 may have the trigger voltage and an on-resistance lower than those of the reverse biased junction diode. Thus, when the negative electrostatic charge may flow into the GPPMOS transistor, the GPPMOS transistor may be turned-on at about −7V to discharge the negative electrostatic charge. In contrast, when the negative electrostatic charge flows into the reverse biased PN diode, the reverse biased PN diode may be driven at about 15V to discharge the negative electrostatic charge. It may be noted that the trigger voltage in the reverse biased PN diode may be generated slower than that of the GPPMOS transistor.

Figure 6:
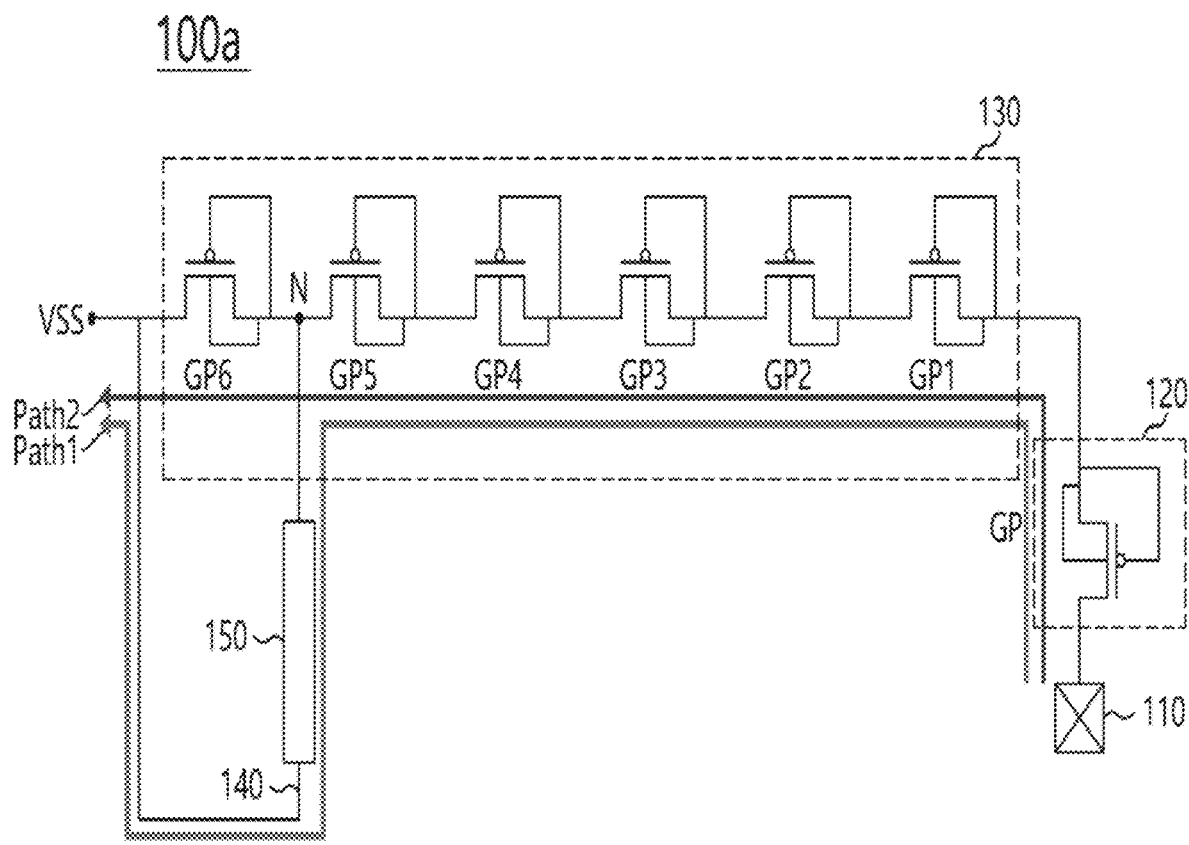
FIG. 6 is a circuit diagram illustrating a semiconductor integrated circuit device including an ESD protection circuit in accordance with embodiments.

FIG. 6 is a circuit diagram illustrating a semiconductor integrated circuit device including an ESD protection circuit in accordance with various embodiments.

Referring to FIG. 6, when the second voltage protection circuit 130 requires at least five GPPMOS transistors GP1~GP5 to discharge the positive electrostatic charge, an ESD protection circuit 100a may further include a sixth GPPMOS transistor GP6 connected between the fifth GPPMOS transistor GP5 and the ground terminal Vss. The sixth GPPMOS transistor GP6 may be used a revision. That is, the sixth GPPMOS transistor GP6 may be used as an extra transistor.

Particularly, the ESD protection circuit 100a may further include a transmission path 140 between a connection node N between the fifth GPPMOS transistor GP5 and the sixth GPPMOS transistor GP6, and the ground terminal Vss. The transmission path 140 may include a revision circuit 150 for revising the ESD protection circuit 100a. The revision circuit 150 may be selectively opened and closed. When the revision circuit 150 is closed, an output current from the fifth GPPMOS transistor GP5 may be directly transmitted to the ground terminal Vss, not through the sixth GPPMOS transistor GP6.

When manufacturing elements such as the GPPMOS transistor, unintended changes may be generated in threshold voltage characteristics due to a process, a voltage and a temperature (PVT). Although the electrostatic charge may be discharged by the five GPPMOS transistors, after the electrostatic charge passes through the five GPPMOS transistors, the electrostatic charge may remain due to the PVT change such as the unintended changes of the threshold voltage.

Therefore, the second voltage protection circuit 130 may selectively include the sixth GPPMOS transistor GP6 by the revision circuit 150.

For example, when the PVT change is not generated, the revision circuit 150 may be opened (might not be driven) so that a direct transmission path path 1 may be generated between the connection node N and the ground terminal Vss. The direct transmission path path 1 may be a path generated between the GPPMOS transistor GP of the first voltage protection circuit 120 and the first to fifth GPPMOS transistors GP1~GP5 of the second voltage protection circuit 130. Thus, the electro-static voltage passing through the fifth GPPMOS transistor GP5 may be discharged to the ground terminal Vss through the signal transmission path path 1 having a relatively low resistance.

In contrast, when the threshold voltages of the GPPMOS transistors GP1~GP5 are decreased due to the changes of the PVT, the revision circuit 150 may be closed (may be driven). Thus, the transmission path 140 might not be generated between the connection node N and the ground terminal Vss. The electro-static voltage passing through the fifth GPPMOS transistor GP5 may be discharged to the ground terminal Vss through the sixth GPPMOS transistor GP 6 (path 2). FIG. 6 also illustrates a first voltage protection circuit 120 and pad 110.

Figure 7:
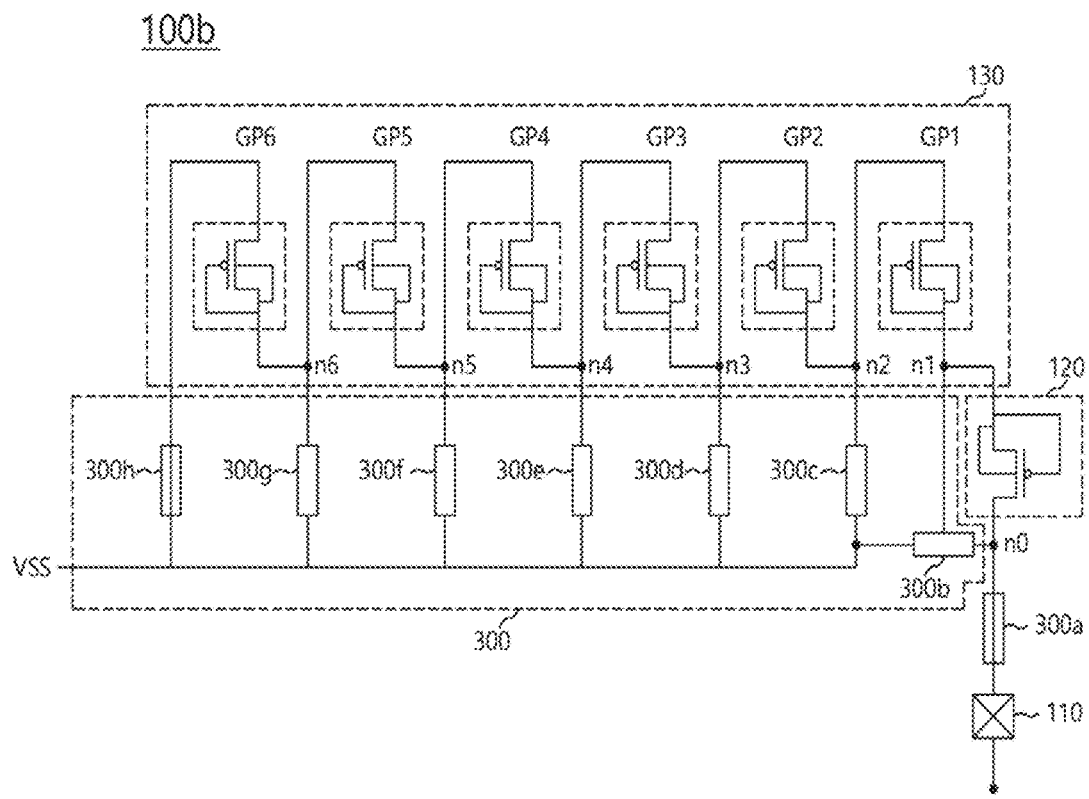
FIGS. 7 and 8 are circuit diagrams illustrating a semiconductor integrated circuit device including an ESD protection circuit in accordance with embodiments.
Figure 8:
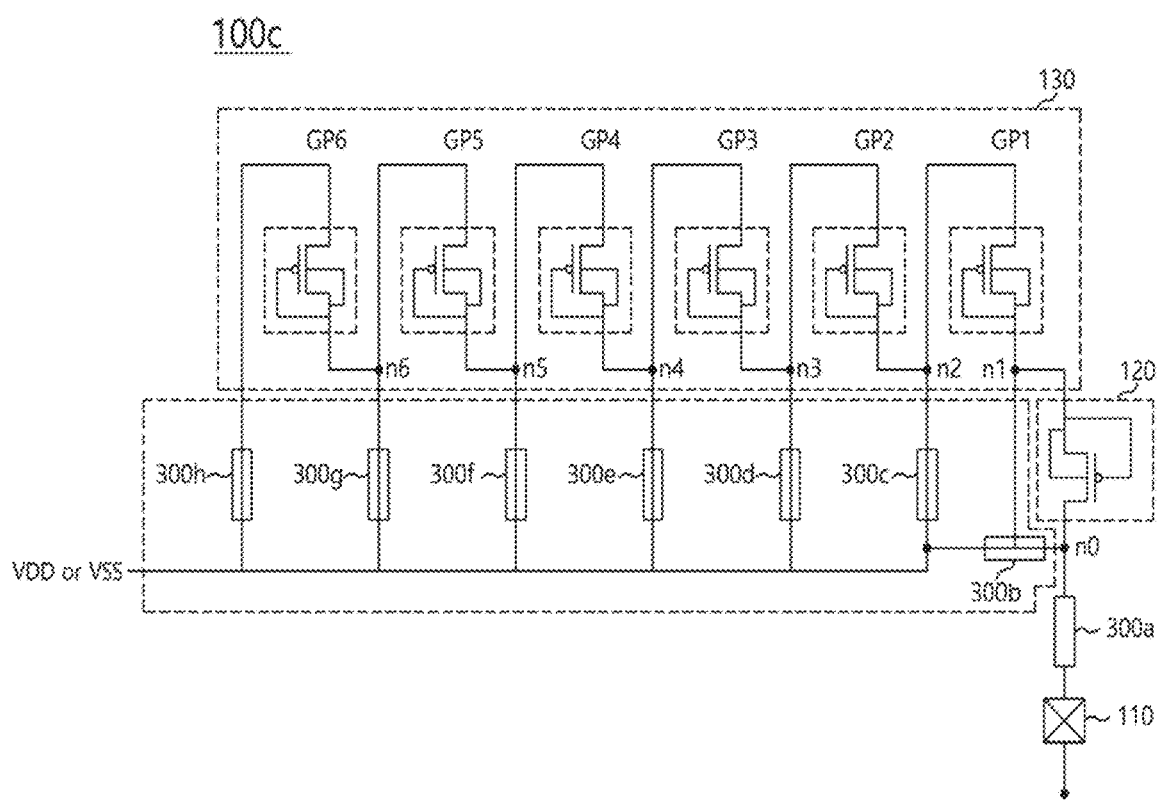

FIGS. 7 and 8 are circuit diagrams illustrating a semiconductor integrated circuit device including an ESD protection circuit in accordance with embodiments.

Referring to FIGS. 7 and 8, ESD protection circuits 100b and 100c may include a revision circuit block 300.

The revision circuit block 300 may change signal transmission paths between the pad 110, the first voltage protection circuit 120, the second voltage protection circuit 130 and the ground terminal Vss. The revision circuit block 300 may include a plurality of revising circuits 300a~300h. Each of the revising circuits 300a~300h may be connected between the pad 110 and the first voltage protection circuit 120, between the first voltage protection circuit 120 and the second voltage protection circuit 130, and between the second voltage protection circuit 130 and the ground terminal Vss.

In an embodiment, when the second voltage protection circuit 130 includes the six GPPMOS transistors GP1~GP6, the revision circuit block 300 may include the eight revising circuits 300a-300h. In still other embodiments, the second voltage protection circuit 130 may include more or less than six GPPMOS transistors and more or less than eight revising circuits.

The first revising circuit 300a may be connected between an input node n0 of the first voltage protection circuit 120 and the pad 110. The pad 110 or the input node n0 may be directly connected to an electrostatic discharge by selectively opening or closing the first revising circuit 300a.

The second revising circuit 300b may be connected among the input node n0, a first connection node n1 between the first voltage protection circuit 120 and the second voltage protection circuit 130, and the ground terminal Vss. Thus, the pad 110 or the first connection node n1 may be directly connected to the ground terminal Vss by selectively opening or closing the second revising circuit 300a.

The third revising circuit 300c may be connected between a second connection node n2 between the first and second GPPMOS transistors GP1 and GP2 and the ground terminal Vss. The fourth revising circuit 300d may be connected between a third connection node n3 between the second and third GPPMOS transistors GP2 and GP3 and the ground terminal Vss. The fifth revising circuit 300e may be connected between a fourth connection node n4 between the third and fourth GPPMOS transistors GP3 and GP4 and the ground terminal Vss. The sixth revising circuit 300f may be connected between a fifth connection node n5 between the fourth and fifth GPPMOS transistors GP4 and GP5 and the ground terminal Vss. The seventh revising circuit 300g may be connected between a sixth connection node n6 between the fifth and sixth GPPMOS transistors GP5 and G6 and the ground terminal Vss. The eighth revising circuit 300h may be connected between a drain of the sixth GPPMOS transistor GP6 and the ground terminal Vss.

The revising circuits 300a-300h may be selectively opened and closed to directly connect the pad 110 or the first voltage protection circuit 120 with the ground terminal Vss in accordance with the inflow of the electro-static voltage or a size of the electro-static voltage, or to control the numbers of the serially connected GPPMOS transistors of the second voltage protection circuit 130.

For example, when all of the first to sixth GPPMOS transistors GP1~GP6 of the second voltage protection circuit 130 may be driven in accordance with the size of the electro-static voltage, as illustrated in FIG. 7, the second to seventh revising circuits 300b-300g may be opened. In contrast, the first and eight revising circuit 300a and 300h may be closed to serially connect the first to sixth GPPMOS transistors GP1~GP6 with each other.

When it might not be required to drive the ESD protection circuit 100c, i.e., when the normal voltage may be inputted from the pad 110, as illustrated in FIG. 8, the first and third to eighth revising circuits 300a and 300c-300h may be closed except for the second revising circuit 300b. Thus, the normal voltage inputted into the pad 110 might not flow into the first and second voltage protection circuits 120 and 130. The normal voltage may be directly transmitted to the ground terminal Vss or a power supply voltage terminal VDD.

When the negative voltage is applied to the pad 110, the first voltage protection circuit 120 may be driven as the GPPMOS transistor to effectively discharge the electrostatic charge.

According to various embodiments, the first voltage protection circuit may include the PMOS transistor having excellent area efficiency, for example, the GPPMOS transistor. Thus, when the GPPMOS transistor is compared to the junction diode for providing the same threshold voltage, the area of the GPPMOS transistor may be remarkably less than an area needed for the junction diode. Further, when the GPPMOS transistor is integrated in an allotted area, the GPPMOS transistor may have the improved current characteristics compared to the reverse characteristics of the junction diode.

Further, the second voltage protection circuit for removing the positive electro-static voltage may include the serially connected GPPMOS transistors. Thus, the snapback voltage may not be considered in setting the trigger voltage.

Furthermore, the ESD protection circuit may include the revision circuit having the revising circuits. Thus, the numbers of the GPPMOS transistors in the ESD protection circuit may be controlled in accordance with the generation of the electrostatic charge or the size of the electrostatic charge.

The above described embodiments are intended to illustrate and not to limit the present disclosure. Various alternatives and equivalents are possible. The disclosure is not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. A semiconductor integrated circuit device comprising:
a pad;
a first voltage protection circuit connected to the pad, the first voltage protection circuit being driven when a negative electrostatic charge flows into the first voltage protection circuit, the first voltage protection circuit including a gate positive p-channel metal oxide semiconductor (GPPMOS) transistor;
a second voltage protection circuit connected between the first voltage protection circuit and a ground terminal, the second voltage protection circuit being driven when a positive electrostatic charge flows into the second voltage protection circuit, the second voltage protection circuit including connected GPPMOS transistors in series; and
a revision circuit block selectively connected between the pad and any one of the connection nodes of the GPPMOS transistors of the second voltage protection circuit to change a transmission path of a voltage inputted from the pad.

2. The semiconductor integrated circuit device of claim 1, wherein the revision circuit block comprises a revising circuit, and
the revising circuit is selectively opened or closed to change the transmission path of the voltage inputted from the pad.

3. The semiconductor integrated circuit device of claim 1, wherein the GPPMOS transistor of the first voltage protection circuit is turned-on by generating a parasitic PNP bipolar transistor when a negative voltage is inputted from the pad, and the GPPMOS transistor of the first voltage protection circuit performs a forward diode operation when a positive voltage is inputted from the pad.

4. The semiconductor integrated circuit device of claim 1, wherein each of the GPPMOS transistors of the first and second voltage protection circuits comprises:
an n-well formed on a semiconductor substrate;
a gate formed on the n-well;
a source formed in the n-well at one side of the gate; and
a drain formed in the n-well at an other side of the gate.

5. The semiconductor integrated circuit device of claim 4, wherein the semiconductor substrate comprises a substrate including p-type impurities, and the n-well directly makes contact with the substrate including the p-type impurities.

6. The semiconductor integrated circuit device of claim 1, wherein numbers of the GPPMOS transistors in the second voltage protection circuit are determined by changing the location of the connection node connected to the revision circuit block in accordance with a size of the positive electro-static voltage.

7. The semiconductor integrated circuit device of claim 1, wherein the GPPMOS transistors of the second voltage protection circuit have substantially the same threshold voltage.

8. The semiconductor integrated circuit device of claim 1, wherein the GPPMOS transistors of the second voltage protection circuit have gradually decreased threshold voltages.

9. The semiconductor integrated circuit device of claim 1, wherein the GPPMOS transistor of the first voltage protection circuit comprises:
   a drain connected to the pad; and
   a gate and a source commonly connected with each other.

10. The semiconductor integrated circuit device of claim 9, wherein each of the serially connected GPPMOS transistors of the second voltage protection circuit comprises:
    a gate and a source commonly connected with each other; and
    a drain connected to the source of a next GPPMOS transistor,
    wherein any one of the GPPMOS transistors of the second voltage protection circuit comprises the source connected to the source of the first voltage protection circuit.

11. A semiconductor integrated circuit device comprising:
    an electrostatic discharge (ESD) protection circuit, wherein the ESD protection circuit is turned-off when a normal voltage is applied from a pad, and the ESD protection circuit is driven by a voltage above and below the normal voltage, the ESD protection circuit comprising:
    a first GPPMOS transistor connected to the pad;
    a plurality of second GPPMOS transistors serially connected between the first GPPMOS transistor and a ground terminal; and
    a revision circuit directly connected between any one of connection nodes among the plurality of second GPPMOS transistors and the ground terminal,
    wherein a signal transmission path is selectively formed or blocked between the connection node of the plurality of second GPPMOS transistors and the ground terminal by the revision circuit.

12. The semiconductor integrated circuit device of claim 11, wherein numbers of the serially connected the plurality of second GPPMOS transistors are determined in accordance with a trigger voltage of the GPPMOS transistor and an electro-static voltage.

13. The semiconductor integrated circuit device of claim 11, wherein the first GPPMOS transistor and the plurality of second GPPMOS transistors are formed in separated n-wells directly making contact with a p-type semiconductor substrate.

* * * * *